(12) United States Patent
Mrawek et al.

(10) Patent No.: US 11,022,787 B2
(45) Date of Patent: Jun. 1, 2021

(54) METHOD AND SIGNAL GENERATOR FOR PRODUCING A CONTROL SIGNAL FOR AN ACOUSTO-OPTICAL ELEMENT

(71) Applicant: Leica Microsystems CMS GmbH, Wetzlar (DE)

(72) Inventors: Patric Mrawek, Hassloch (DE); Thorsten Koester, Edingen-Neckarhausen (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 93 days.

(21) Appl. No.: 16/226,668

(22) Filed: Dec. 20, 2018

(65) Prior Publication Data

US 2019/0196162 A1   Jun. 27, 2019

(30) Foreign Application Priority Data

Dec. 22, 2017   (DE) .................. 10 2017 223 760.0

(51) Int. Cl.
| | | |
|---|---|---|
| *G02B 21/00* | (2006.01) | |
| *G02F 1/11* | (2006.01) | |
| *G01J 3/12* | (2006.01) | |
| *G02F 1/33* | (2006.01) | |
| *G02B 26/08* | (2006.01) | |

(52) U.S. Cl.
CPC .......... *G02B 21/008* (2013.01); *G01J 3/1256* (2013.01); *G02B 21/0032* (2013.01); *G02B 21/0072* (2013.01); *G02F 1/11* (2013.01); *G02F 1/33* (2013.01); *G02B 26/08* (2013.01)

(58) Field of Classification Search
CPC ... G02F 1/33; G02F 1/113; G02F 1/11; G02F 1/332; G02F 2203/18; G02F 2203/58; G02B 21/008; G02B 21/24; G02B 21/0076; G02B 21/0072; G02B 21/0032; G02B 26/08; G01J 3/1256; H03C 1/46; H03C 1/52; H03C 2200/0058
USPC ........................................................ 359/305
See application file for complete search history.

(56) References Cited

U.S. PATENT DOCUMENTS

2001/0022532 A1*  9/2001  Dolman ............... H03F 1/3247
                                                          330/149
2011/0304900 A1* 12/2011  Widzgowski ...... G02B 21/0032
                                                          359/287

FOREIGN PATENT DOCUMENTS

WO   WO 2011154501 A1   12/2011

\* cited by examiner

*Primary Examiner* — Mohammed A Hasan
(74) *Attorney, Agent, or Firm* — Leydig, Voit & Mayer, Ltd.

(57) ABSTRACT

A method for generating a control signal for an acousto-optical element includes generating a raw signal using at least one correction term by an IQ modulation from a target I component and a target Q component, and amplifying the raw signal to become the control signal. The target I component and/or the target Q component are corrected using the at least one correction term. The at least one correction term is obtained from an analysis of the control signal.

15 Claims, 4 Drawing Sheets

METHOD AND SIGNAL GENERATOR FOR PRODUCING A CONTROL SIGNAL FOR AN ACOUSTO-OPTICAL ELEMENT

CROSS-REFERENCE TO PRIOR APPLICATION

Priority is claimed to German Patent Application No. DE 10 2017 223 760.0, filed on Dec. 22, 2017, the entire disclosure of which is hereby incorporated by reference herein.

FIELD

The present invention relates to two methods and a signal generator for generating a control signal for an acousto-optical element, and, furthermore, an arrangement of such a signal generator with an acousto-optical element, and a microscope having such an arrangement.

BACKGROUND

Regardless of the method used, a significant challenge in fields of microscopy is the provision of excitation light with one or more predefined wavelengths. Depending upon the type of microscopy method and/or the type of specimen, one or more excitation light beams, which generally must have predefined spectral properties, may be necessary.

For example, in the field of fluorescence microscopy, it is important to use light having the wavelength that excites fluorescence. Different wavelengths are used, in particular, when the specimen contains fluorescent substances having different emission wavelengths.

In the field of confocal scanning microscopy, it is of particular interest to adapt the intensities for specific wavelengths, or to switch on or off certain wavelengths.

Wavelength-selective elements based upon the acousto-optical effect can be used for this purpose. Such acousto-optical elements typically have a so-called acousto-optical crystal which is made to oscillate by means of an acoustic signal transmitter—also referred to as a converter or transducer. As a rule, such a transducer has a piezoelectric material and two or more electrodes contacting this material. By electrical connection of the electrodes to high frequencies, which are typically within the range between 10 MHz and 10 GHz, the piezoelectric material is excited to oscillate so that an acoustic wave can be produced which passes through the crystal. Acousto-optical crystals are distinguished in that the sound wave which is produced alters the optical properties of the crystal.

Examples of such acousto-optical elements are acousto-optical tunable filters (AOTF), acousto-optical modulators (AOM), acousto-optical deflectors (AOD), acousto-optical beam splitters (AOBS), and acousto-optical beam mergers (AOBM).

Controlling acousto-optical elements is a particular challenge. The high-frequency electrical signals for the converter are usually generated in a frequency generator (for example, a voltage-controlled oscillator (VCO), a phase-locked loop (PLL), or a synthesizer according to the DDS method (direct digital synthesis) and amplified by means of high-frequency amplifiers such that the amplitude is sufficient to set the crystal into oscillation. With several, simultaneously applied, different control frequencies, light beams of several wavelengths simultaneously (for example, in the case of an AOTF, AOBS, AOBM, AOM) or a wavelength of an incident light beam can be deflected into several light beams of different directions simultaneously (for example, at an AOD).

For generating a control signal with multiple frequencies, single frequency generators, e.g., DDS synthesizers, which each generate, for example, a sinusoidal signal, may be combined, e.g., by analog mixing of the output signals. Alternatively, a digital superposition, such as is shown in WO 2011/154501 A1, is also possible.

SUMMARY

In an embodiment, the present invention provides a method for generating a control signal for an acousto-optical element. A raw signal is generated using at least one correction term by an IQ modulation from a target I component and a target Q component, and is amplified to become the control signal. The target I component and/or the target Q component are corrected using the at least one correction term. The at least one correction term is obtained from an analysis of the control signal.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
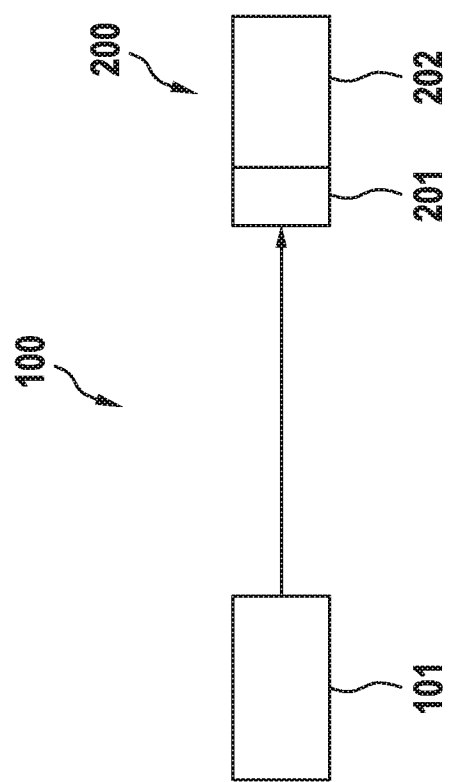
FIG. 1 shows an arrangement of a signal generator and an acousto-optical element according to an embodiment of the invention.

The inventors have recognized that the amplification behavior of high-frequency amplifiers is generally not consistently linear over the entire spectrum. Thus, even if an input signal of the amplifier is already adapted to the requirements of the acousto-optical elements, the amplified signal can have phase shifts, amplitude shifts, and harmonics with mixed frequencies. This can result in unwanted wavelength components being selected by the acousto-optical elements. It is therefore the aim of embodiments of the present invention to take into account non-linearities of the amplifier when controlling an acousto-optical element.

According to embodiments of the invention, two methods and a signal generator for generating a control signal for an acousto-optical element, an arrangement of such a signal generator and an acousto-optical element, and a microscope with such an arrangement are provided.

Embodiments of the invention present possibilities for producing a control signal for an acousto-optical element, such that, despite amplification with a non-linear transfer function, the control signal has the desired signal shape, and non-linearities of the amplifier have no effect on the control of an acousto-optical element. In this case, embodiments of the invention provide two possibilities which are based upon the pre-distortion of the raw signal—before it is amplified to become the control signal—founded on a comparison of an amplified signal with the unamplified signal—in one variant using the control signal itself, and in another variant using a reference signal.

According to a first embodiment of the invention, a raw signal is generated using at least one correction term by means of an IQ modulation consisting of a target I component and a target Q component and amplified to become the control signal, wherein the target I component and/or the target Q component are corrected using the at least one correction term, wherein the at least one correction term is obtained from an analysis of the control signal. It is likewise possible to generate the raw signal using several IQ modulations, each consisting of a target I component and a target Q component and a carrier frequency, and to combine the results—in particular, by addition—into the raw signal. This aspect of this embodiment of the invention essentially corresponds to a regulation of the signal shape of the control signal during the control, so that very good results are thereby achieved. The non-linearities of the transfer function of the amplification are thus compensated for by correcting the raw signal. In particular, changes in the transfer function during operation, e.g., due to temperature fluctuations or the like, are thus taken into consideration and compensated for.

The generation of the raw signal by means of IQ modulation furthermore has the advantage that the control signal for the acousto-optical element can be generated with a desired frequency spectrum by first transforming the frequency spectrum into a signal in the time domain by means of an inverse Fourier transform, which signal is then modulated by means of the IQ modulation onto a carrier signal having a carrier frequency. The real part of this modulated signal is then the raw signal having the desired frequency spectrum around the carrier frequency. Alternatively, several frequency spectra can also be transformed into several signals in the time domain, from which several modulated signals are then again obtained whose real parts are combined into the raw signal.

Particularly in cases in which the control signal is to have several frequencies, i.e., at least two, only one frequency spectrum composed of at least two frequencies, or several frequency spectra which together have the at least two frequencies, and one or more single-sideband modulators are required in order to easily obtain the desired control signal for the acousto-optical element.

In IQ modulation, as is known, two baseband signals (I and Q) are modulated onto the carrier signal by mixing. In so doing, one of the two baseband signals (Q) is obtained from the transmitted signal using a Hilbert transformation. For more details, refer to the relevant technical literature.

An embodiment of the invention exploits this simple generation of a control signal for the acousto-optical element to perform a compensation of the non-linear amplification in the high-frequency amplifier.

The analysis of the control signal preferably comprises an IQ demodulation for obtaining an actual I component and an actual Q component, wherein the at least one correction term is determined from a comparison of the actual I component with the target I component, and/or from a comparison of the actual Q component with the target Q component. This form of signal analysis is particularly suitable for the proposed method, since it provides direct comparators for regulation.

In an advantageous embodiment, IQ demodulation is performed by converting the output signal of the amplifier into a digital signal, a complex Fourier transform, and a coordinate transformation. The additional method steps can be carried out computationally by conversion into a digital signal. The individual frequency components can be determined by means of the Fourier transform, whereby, after conversion into Cartesian coordinates, the baseband signals (actual values) are obtained, from which—in particular, by forming the difference with the original baseband signals (target values)—correction values are then obtained which can be summed to form the original baseband signals in order to obtain corrected baseband signals, and thus a corrected raw signal.

According to a further embodiment of the invention, a raw signal is pre-distorted by means of a correction function and amplified into the control signal according to a transfer function, wherein the correction function is obtained by amplifying a reference signal according to the transfer function into an amplified reference signal and comparing the amplified reference signal with the reference signal. The raw signal can be generated in any manner—in particular, also by means of the IQ modulation described above.

This variant has the advantage that the properties of the non-linear transfer function can be determined in advance and used for determining the correction function—which is, in particular, the inverse of the transfer function—before the actual control signal is generated. During operation, complicated calculations are no longer necessary, so that this method places fewer demands on the performance of the signal generator, but nevertheless yields very good results.

In an advantageous embodiment, the transfer function is approximated as a polynomial—in particular, of the third degree. This type of approximation is normally sufficient, and yet easy to analyze, for high-frequency amplifiers suitable for transfer functions.

This analysis can preferably comprise a Fourier transform—in particular, FFT or DFT—in order to determine the coefficients of the polynomial from the amplified reference signal after its digitization. These are familiar methods, for which prefabricated signal processors are available. The determination of the coefficient is particularly easy if the reference signal has only two frequencies.

In an advantageous embodiment, the acousto-optical element is selected from an acousto-optically tunable filter, an acousto-optical modulator, an acousto-optical deflector, an acousto-optical beam splitter, and an acousto-optical beam combiner.

Further advantages and embodiments of the invention are given by the description and the accompanying drawing.

It is to be understood that the features mentioned above and the features to be explained in detail below can be used not only in the respective indicated combination, but also in other combinations or alone, without departing from the scope of the present invention.

FIG. 1 schematically shows an arrangement 100 with a signal generator 101 and an acousto-optical element 200 according to a preferred embodiment of the invention.

The signal generator 101 serves to control the acousto-optical element 200, which has an acousto-optical crystal 202 and a piezoelectric transducer 201 for setting the crystal 202 to mechanical oscillations. The acousto-optical element serves to influence light in a desired manner, e.g., as a frequency selector.

Figure 2:
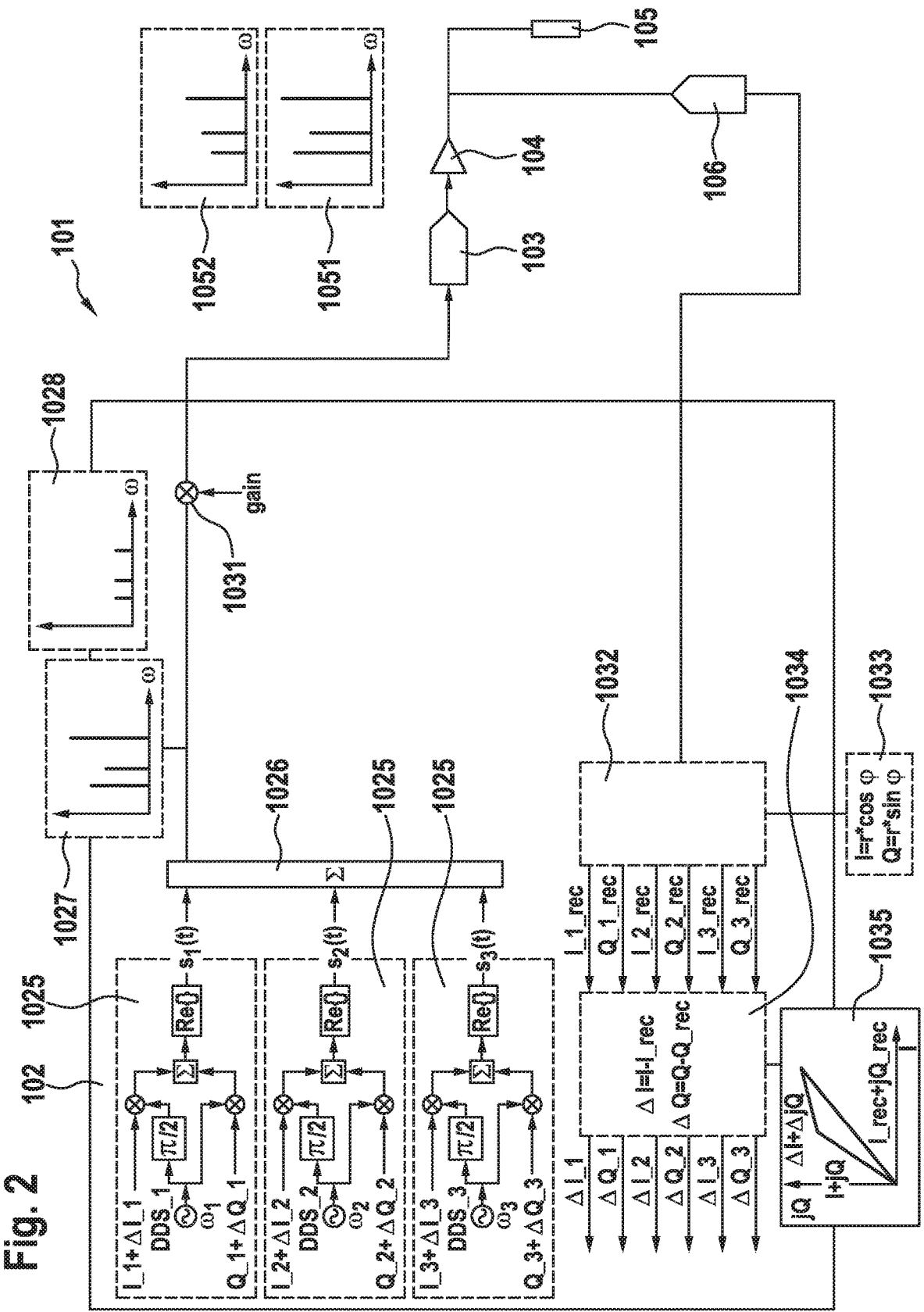
FIG. 2 shows, in the manner of a circuit diagram, such an arrangement from FIG. 1 according to a first embodiment of the invention.

FIG. 2 shows a signal generator 101 in a function-oriented representation according to a preferred embodiment of the invention. In the example shown, the signal generator 101 has a function unit 102 for signal generation that can be designed, for example, as an FPGA. The functional unit 102 is configured to execute a preferred embodiment of the invention and generate a (digital) raw signal. Furthermore, the signal generator 101 has a digital-to-analog converter 103 for converting the digital raw signal into an analog raw signal, and an amplifier 104 for amplifying the analog raw signal into the control signal. The control signal is applied to the acousto-optical element 105 as a load.

As mentioned in the introduction, amplifiers, such as amplifier 104, do not have a linear transfer function over the entire frequency range, so that the amplification also results in distortions, and the shape of the control signal deviates from the shape of the raw signal. According to the portrayed embodiment of the invention, the signal generator 101 is thus configured to pre-distort (or to correct) the raw signal in such a way that these non-linearities are compensated for.

In the example shown, the digital raw signal is composed of three transmission signals $s_1(t)$, $s_2(t)$, and $s_3(t)$ generated by means of IQ modulation. The transmission signals $s_1$, $s_2$, and $s_3$ are each composed of two baseband signals I and Q. Both components I, Q are mixed (i.e., frequency-shifted) in an I/Q-modulator 1025 with a sine or cosine component of a carrier signal with a frequency $\omega_j$ (j=1, 2, 3) and combined, in order to obtain a modulated signal whose real part is then output as an output signal $s_j(t)$ (j=1, 2, 3).

The raw signal is then obtained as a combination (i.e., sum) 1026 of the real parts of the several modulated signals $s_1(t)$, $s_2(t)$, and $s_3(t)$. This digital signal that is generated in the functional unit 102 and has an amplitude spectrum 1027 and a phase spectrum 1028 can there still be multiplied in a term 1031 with a gain or weighting factor, and is then output as a digital raw signal.

The amplitude spectrum 1027 and the phase spectrum 1028 of the raw signal generated in this way are likewise shown in FIG. 2.

Then, it is converted in the digital-to-analog converter 103 into an analog raw signal and amplified in the amplifier 104 before it is output as a control signal with an amplitude spectrum 1051 and a phase spectrum 1052 to the load 105—preferably, an acousto-optical element.

The amplitude spectrum 1051 and the phase spectrum 1052 of the control signal are also shown in FIG. 2. It can be seen that the amplitudes of the frequencies $\omega_1$, $\omega_2$, and $\omega_3$ have been amplified to different degrees. Moreover, it can be seen in the phase spectrum 1052 that a frequency-dependent phase shift has taken place.

To compensate for the non-linearity of the amplifier 104, the output of the amplifier 104 is now converted to a digital signal in an analog-to-digital converter 106 and returned to functional unit 102 for analysis. There, in an I/Q demodulator 1032, first determined from this signal are the actual components I_1_rec and Q_1_rec for the carrier frequency $\omega_1$, the actual components I_2_rec and Q_2_rec for the carrier frequency $\omega_2$, and the actual components I_3_rec and Q_3_rec for the carrier frequency $\omega_3$.

This is done, for example, by a complex fast Fourier transform and a coordinate transformation. The conversion equations for the coordinate transformation are shown in block 1033.

In a comparator or difference calculator 1034, the differences ΔI_1, ΔQ_1, ΔI_2, ΔQ_2, ΔI_3, and ΔQ_3 between the target components I_1, I_2, I_3, Q_1, Q_2, and Q_3 and the actual components I_1_rec, Q_1_rec, I_2_rec, Q_2_rec, I_3_rec, and Q_3_rec are then determined. Block 1035 shows the principal difference calculation in the complex plane. The calculated differences ΔI_1, ΔQ_1, ΔI_2, ΔQ_2, ΔI_3, and ΔQ_3 form the correction terms for the target components in the I/Q modulators 1025.

For example, FIG. 2 shows that the transmission signal $s_1(t)$ with frequency $\omega_1$ is generated from the baseband signals I_1+ΔI_1 and Q_1+ΔQ_1, the transmission signal $s_2(t)$ with frequency $\omega_2$ is generated from the baseband signals I_2+ΔI_2, and Q_2+ΔQ_2, and the transmission signal $s_3(t)$ with frequency $\omega_3$ is generated from the baseband signals I_3+ΔI_3 and Q_3+ΔQ_3.

Figure 3:
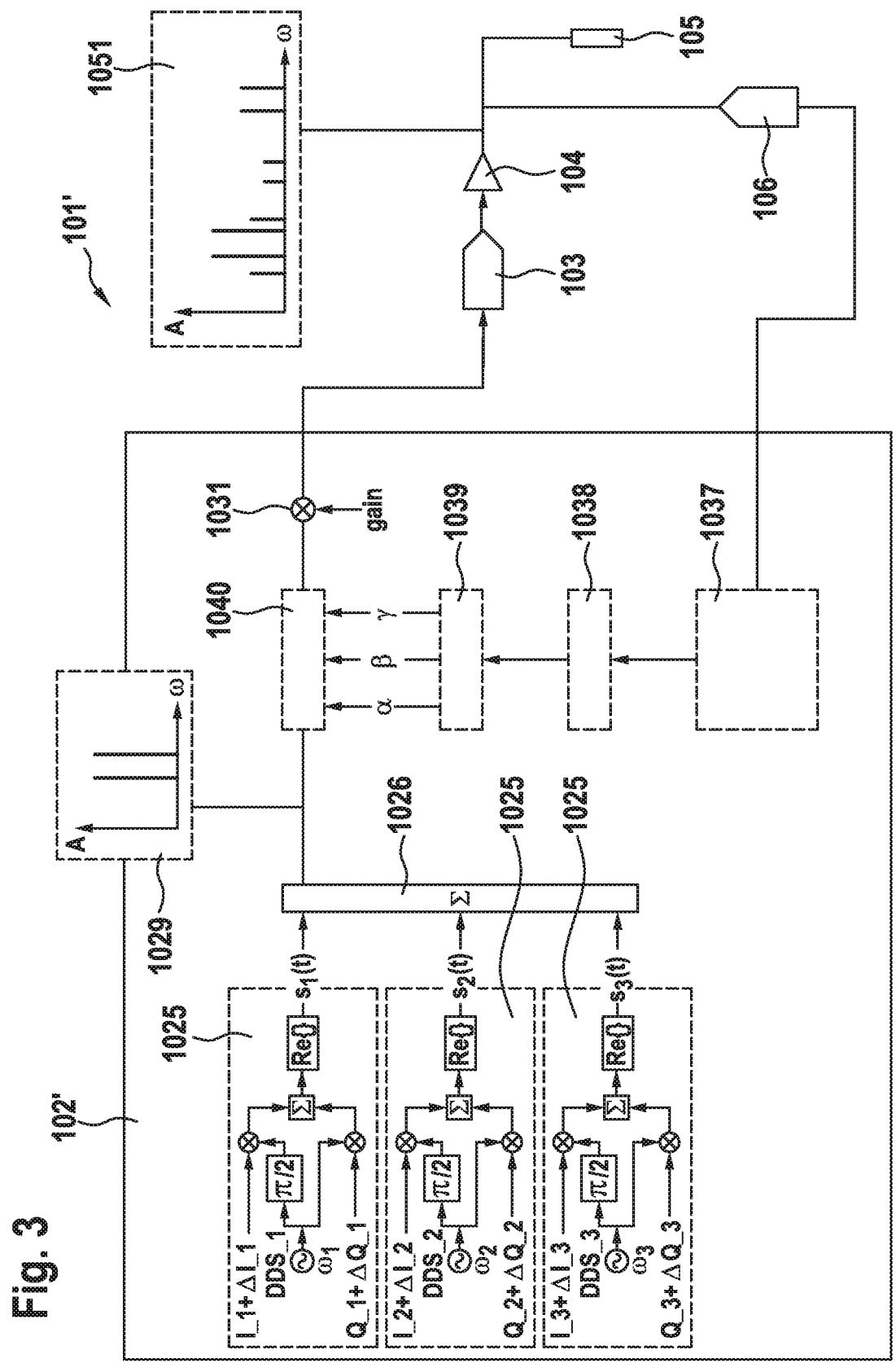
FIG. 3 shows, in the manner of a circuit diagram, such an arrangement from FIG. 1 according to a second embodiment of the invention.

In a functional representation, FIG. 3 also shows a signal generator 101' according to another preferred embodiment of the invention that is composed of a functional unit 102', the digital-to-analog converter 103, the amplifier 104, and the analog-to-digital converter 106.

The functional unit 102' is adapted to execute another preferred embodiment of the invention and to generate a (digital) raw signal.

Here too, as in FIG. 2, the raw signal, denoted here by x, is composed of three transmit signals $s_1(t)$, $s_2(t)$, and $s_3(t)$ generated by IQ modulation 1025.

In contrast to FIG. 2, however, a correction or pre-distortion is, here, not carried out by changing the baseband signals I_1, I_2, I_3, Q_1, Q_2, and Q_3, but rather, in a corrector 1040, by changing the raw signal x into y. This method is based upon determining the transfer function of the amplifier 104 and pre-distorting the raw signal in the corrector with the inverse of the transfer function.

The transfer function of the amplifier 104 in the present example is approximated by a third degree polynomial $y=\alpha x+\beta x^2+\gamma x^3$ so that—for example, to correct this nonlinear behavior—the raw signal x is pre-distorted in the corrector 1040 with the inverse $y=(\alpha x+\beta x^2+\gamma x^3)^{-1}$ of the transfer function.

The coefficients $\alpha$, $\beta$, and $\gamma$ of the polynomial are determined, e.g., by using a reference signal with a known frequency spectrum 1029, before the actual control. This reference signal consists, for example, of the sum of two cosine functions $x=A\cos\omega_1 t * B\cos\omega_2 t$ with different frequencies $\omega_1$, $\omega_2$. The amplification of this raw signal in amplifier 104 results in a frequency spectrum 1051, which is likewise shown in the figure. The non-linearity of the amplifier 104 also yields the harmonics $2\omega_1$, $2\omega_2$, $3\omega_1$, and $3\omega_2$, as well as mixed frequencies $2\omega_1-\omega_2$ and $2\omega_2-\omega_1$, in addition to the two frequencies $\omega_1$ and $\omega_2$. Further harmonics and mixed terms exist, but these are ignored for further calculation at this point.

The output signal of the amplifier 104 is converted in an analog-to-digital converter 106 and returned to the functional unit 102 for analysis. Here, a complex Fourier transform 1037 is now first carried out in order to determine the frequency spectrum. In an amplitude determiner 1038, the amplitudes of the relevant frequencies $\omega_1$, $2\omega_1$, and $3\omega_1$ are determined. From the I and the Q components at frequency $\omega_1$, the amplitude at $\omega_1$ results in $(I\_\omega_1)^2+(Q\_\omega_1)^2$. From the I and Q component at frequency $2\omega_1$, the amplitude at $2\omega_1$ results in $(I\_2\omega_1)^2+(Q\_2\omega_1)^2$, and, from the I and Q component at frequency $3\omega_1$, the amplitude at $3\omega_1$ results in $(I\_3\omega_1)^2+(Q\_3\omega_1)^2$.

In a coefficient determiner 1039, the coefficients of the polynomial are then determined from the amplitudes. The amplitude at on corresponds to $\alpha A$. The amplitude at $2\omega_1$ corresponds to $\frac{1}{2}\beta A^2$. The amplitude at $3\omega_1$ corresponds to $\frac{1}{4}\gamma A^3$. Since A is known from the test signal, the coefficients of the polynomial can thus be determined. In this way, the raw digital signal x may, using a correction function, be pre-distorted as desired in the corrector 1040.

Figure 4:
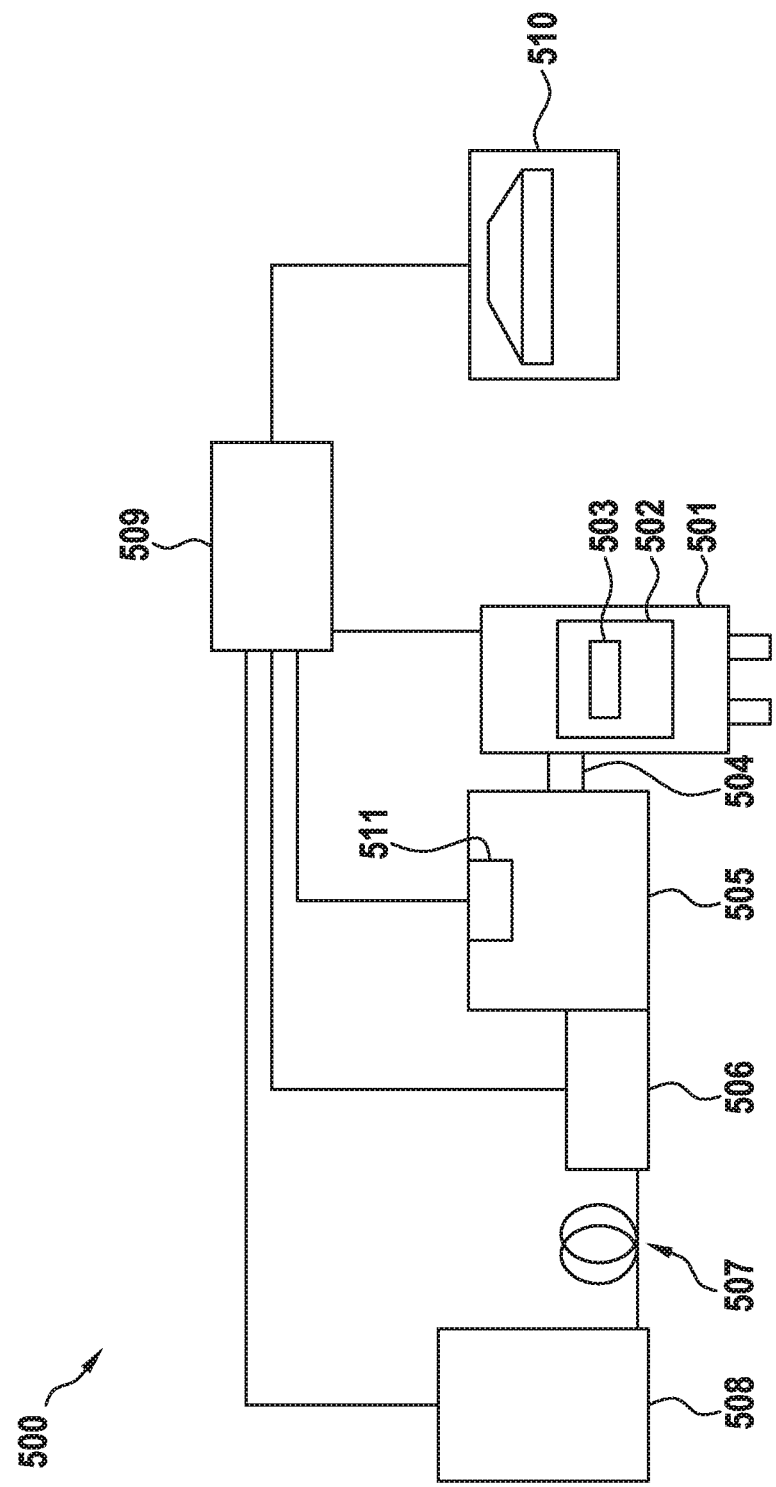
FIG. 4 shows an overview of the typical elements of a confocal microscope in a schematic view.

FIG. 4 schematically shows a confocal microscope with typical components. The overall system is designated 500. The confocal scanning and detection unit is designated 505. The associated illumination device is designated 506. An arrangement according to FIG. 1 is provided in the illumination device.

508 is a laser light source connected to illumination device 506 via illumination fiber 507. The laser light is influenced in the illumination device 506, if desired, by means of an acousto-optical element.

504 denotes an optical adapter for the confocal scanning and detection unit 505 on the microscope stand 501. The specimen stage 502 with a specimen 503 to be examined is within the stand 501. A control unit 509 is connected to the individual components 508, 506, 505, and 501 via corresponding connection lines. A computer with control and display programs is designated with 510; it too is connected to the control unit 509.

In a first variant, a classic confocal beam path is arranged within the confocal scanning and detection unit 505 and is constructed in a known manner with a single pinhole and a beam scanner—for example, a mirror scanner.

In a second variant, within the confocal scanning and detection unit 505, a beam path is located by which the specimen is simultaneously illuminated with one or more illumination points, or one illumination point extended in one direction. Accordingly, the photons to be detected are, for example, selected with a geometric arrangement of pinhole diaphragms (pinholes).

The specimen 503 to be examined is illuminated via a microscope optical system, and imaged via the same microscope optical system on, in particular, a sensor arrangement 511 which, depending upon the embodiment of the confocal scanning and detection unit 505, consists of a photomultiplier or an array of photomultipliers. The mode of operation of a system 500 depicted in FIG. 4 is well known per se and therefore does not need to be explained in further detail here.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

100 Arrangement
101, 101' Signal generator
102, 102' Function unit
103 Digital-to-analog converter
104 Amplifier
105 Load
106 Analog-to-digital converter
1025 I/Q modulator
1026 Summer
1027, 1028, 1029 Spectrum
1051, 1052 Spectrum
1031 (Digital) amplifier
1032 I/Q demodulator
1033 Coordinate transformation
1034 Difference calculator
1035 Difference in complex plane
1037 Fourier transformer
1038 Amplitude determiner
1039 Coefficient determiner
1040 Corrector
200 Acousto-optical element
201 Piezoelectric transducer
202 Acousto-optical crystal
500 Microscope system
501 Microscope stand with microscope optics
502 Specimen stage
503 Specimen
504 Optical adapter
505 Confocal scanning and detection unit
506 Illumination device
507 Illumination fiber
508 Laser light source
509 Control unit
510 Computer with control and display programs
511 Sensor arrangement

The invention claimed is:

1. A method for generating a control signal for an acousto-optical element, the method comprising:
   generating a digital raw signal using at least one correction term by an IQ modulation from a target I component and a target Q component; and
   amplifying the digital raw signal to become the control signal,
   wherein the target I component and/or the target Q component are corrected using the at least one correction term, and
   wherein the at least one correction term is obtained from an analysis of the control signal.

2. The method according to claim 1, wherein the analysis of the control signal comprises performing an IQ demodulation so as to obtain an actual I component and an actual Q component, wherein the at least one correction term is determined from a comparison of the actual I component with the target I component, and/or from a comparison of the actual Q component with the target Q component.

3. The method according to claim 2, wherein the IQ demodulation comprises a complex Fourier transform and a coordinate transformation.

4. The method according to claim 1, wherein the acousto-optical element is controlled with the control signal.

5. A signal generator for controlling an acousto-optical element, the signal generator being configured to execute the method according to claim 1.

6. An arrangement comprising the signal generator according to claim 5 and the acousto-optical element.

7. The arrangement according to claim 6, wherein the acousto-optical element is selected from the group consisting of an acousto-optically tunable filter, an acousto-optical modulator, an acousto-optical deflector, an acousto-optical beam splitter, and an acousto-optical beam combiner.

8. A microscope comprising the arrangement according to claim 6.

9. The method according to claim 1, wherein the digital raw signal is generated by modulating two baseband signals I and Q that are corrected using the at least one correction term onto a carrier signal having a carrier frequency.

10. The method according to claim 9, wherein the carrier frequency is predetermined based on a frequency spectrum of the acousto-optical element.

11. A method for generating a control signal for an acousto-optical element, the method comprising:
pre-distorting a raw signal by a correction function; and
amplifying the raw signal to become a triggering signal according to a transfer function,
wherein the correction function is obtained by amplifying a reference signal according to the transfer function to become an amplified reference signal, wherein the transfer function is approximated as a polynomial with coefficients, and the amplified reference signal is compared with the reference signal.

12. The method according to claim 11, wherein the transfer function is determined from the comparison of the amplified reference signal with the reference signal.

13. The method according to claim 11, wherein the coefficients of the polynomial are determined from the amplified reference signal by a Fourier transform.

14. The method according to claim 11, wherein the correction function is obtained from the inverse transfer function.

15. The method according to claim 11, wherein the polynomial is of the third degree.

* * * * *